(12) United States Patent
Collins

(10) Patent No.: US 11,562,993 B2
(45) Date of Patent: Jan. 24, 2023

(54) EMBEDDED MEMORY DEVICE AND METHOD FOR EMBEDDING MEMORY DEVICE IN A SUBSTRATE

(71) Applicant: Intel Corporation, Santa Clara, CA (US)

(72) Inventor: Andrew Collins, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 18 days.

(21) Appl. No.: 17/222,923

(22) Filed: Apr. 5, 2021

(65) Prior Publication Data

US 2021/0225828 A1 Jul. 22, 2021

Related U.S. Application Data

(62) Division of application No. 16/119,837, filed on Aug. 31, 2018, now Pat. No. 11,018,124.

(51) Int. Cl.
*H01L 25/18* (2006.01)
*H01L 23/538* (2006.01)
(Continued)

(52) U.S. Cl.
CPC .............. *H01L 25/18* (2013.01); *G11C 29/04* (2013.01); *H01L 21/4857* (2013.01); *H01L 23/13* (2013.01); *H01L 23/3675* (2013.01); *H01L 23/481* (2013.01); *H01L 23/5386* (2013.01); *H01L 23/5389* (2013.01); *H01L 24/05* (2013.01); *H01L 24/24* (2013.01);
(Continued)

(58) Field of Classification Search
CPC . H01L 25/18; H01L 25/0657; H01L 23/5389; H01L 24/05; H01L 21/4857; H01L 24/81; H01L 23/5386; H01L 24/82; H01L 25/50; H01L 23/481; H01L 24/24; H01L 2225/06541; H01L 2224/73209
See application file for complete search history.

(56) References Cited

U.S. PATENT DOCUMENTS 7,378,733 B1 * 5/2008 Hoang .................. H01L 23/642
257/E23.178
2007/0232050 A1 10/2007 Toyama
(Continued)

*Primary Examiner* — Julia Slutsker
(74) *Attorney, Agent, or Firm* — Schwabe, Williamson & Wyatt, P.C.

(57) ABSTRACT

A system and method of providing high bandwidth and low latency memory architecture solutions for next generation processors is disclosed. The package contains a substrate, a memory device embedded in the substrate via EMIB processes and a processor disposed on the substrate partially over the embedded memory device. The I/O pads of the processor and memory device are vertically aligned to minimize the distance therebetween and electrically connected through EMIB uvias. An additional memory device is disposed on the substrate partially over the embedded memory device or on the processor. I/O signals are routed using a redistribution layer on the embedded memory device or an organic VHD redistribution layer formed over the embedded memory device when the additional memory device is laterally adjacent to the processor and the I/O pads of the processor and additional memory device are vertically aligned when the additional memory device is on the processor.

18 Claims, 9 Drawing Sheets

(51) Int. Cl.
 H01L 23/00 (2006.01)
 G11C 29/04 (2006.01)
 H01L 23/48 (2006.01)
 H01L 23/367 (2006.01)
 H01L 21/48 (2006.01)
 H01L 25/00 (2006.01)
 H01L 25/065 (2006.01)
 H01L 23/13 (2006.01)

(52) U.S. Cl.
 CPC .............. *H01L 24/81* (2013.01); *H01L 24/82* (2013.01); *H01L 25/0657* (2013.01); *H01L 25/50* (2013.01); *G11C 2029/0401* (2013.01); *H01L 24/16* (2013.01); *H01L 24/73* (2013.01); *H01L 2224/16145* (2013.01); *H01L 2224/16235* (2013.01); *H01L 2224/24145* (2013.01); *H01L 2224/73209* (2013.01); *H01L 2225/06541* (2013.01); *H01L 2225/06565* (2013.01); *H01L 2225/06582* (2013.01); *H01L 2225/06589* (2013.01); *H01L 2225/06596* (2013.01); *H01L 2924/1433* (2013.01); *H01L 2924/1436* (2013.01); *H01L 2924/1437* (2013.01)

(56) References Cited

U.S. PATENT DOCUMENTS

| | | |
|---|---|---|
| 2009/0325415 A1 | 12/2009 | Brist |
| 2014/0174807 A1 | 6/2014 | Roy |
| 2014/0264791 A1* | 9/2014 | Manusharow ...... H01L 23/5383 438/107 |
| 2015/0235915 A1 | 8/2015 | Liang |
| 2015/0255411 A1* | 9/2015 | Karhade ............... G06F 1/1694 361/679.55 |
| 2016/0093597 A1* | 3/2016 | Chang ................ H01L 25/0652 257/737 |
| 2016/0172274 A1* | 6/2016 | Yoon ................. H01L 23/49541 257/664 |
| 2016/0322340 A1* | 11/2016 | Li ...................... H01L 25/0657 |

* cited by examiner

EMBEDDED MEMORY DEVICE AND METHOD FOR EMBEDDING MEMORY DEVICE IN A SUBSTRATE

CROSS-REFERENCE TO RELATED APPLICATIONS

This application is a division of U.S. patent application Ser. No. 16/119,837, filed on Aug. 31, 2018, the entire contents of which is hereby incorporated by reference herein.

TECHNICAL FIELD

This disclosure relates generally to high bandwidth and low latency memory packaging architectures in electronic devices. Some embodiments are related to a manufacturing process to provide high bandwidth and low latency memory architectures. Some embodiments are related to use of embedded active memory devices in connection with an Application-Specific Integrated Circuit/System on a Chip (ASIC/SOC).

BACKGROUND

Electronic devices continue to permeate every aspect of daily life. Among the many types of electronic devices, smartphones and other electronic communication devices that rely on microelectronics have exploded in popularity over the last several decades. Such devices may use various types of circuitry, such as an Application-Specific Integrated Circuit (ASIC), which may be a gate-array customized for the particular use of the ASIC, or low power consumption integrated circuitry such as a System on a Chip (SOC), which may include a single substrate that contains a central processing unit (CPU), memory, input/output ports and storage.

Packaging of electronic devices continues to be of importance as it is desirable to increase the number of die-to-die connections. Traditional high bandwidth die-to-die connections using a silicon interposer with Through Silicon Vias (TSVs) to connect die, while sufficient in some circumstances, have resulted in complex layouts and manufacturing techniques reduce yield among others. The silicon interposer may have a high cost overhead and the TSVs for non-die-to-die I/O/power may suffer from additional capacitance and resistance associated with the additional interconnect. Traditional high bandwidth memory (HBM)-based on-package memory solutions are high bandwidth, high memory capacity and high cost due to the TSV process used in the Dynamic Random Access Memory. It is desired to increase the bandwidth available and decrease the latency in data communications, in particular when for applications that may use large amounts of processing, such as next generation artificial intelligence and graphics processors.

DESCRIPTION OF EMBODIMENTS

Figure 1A:
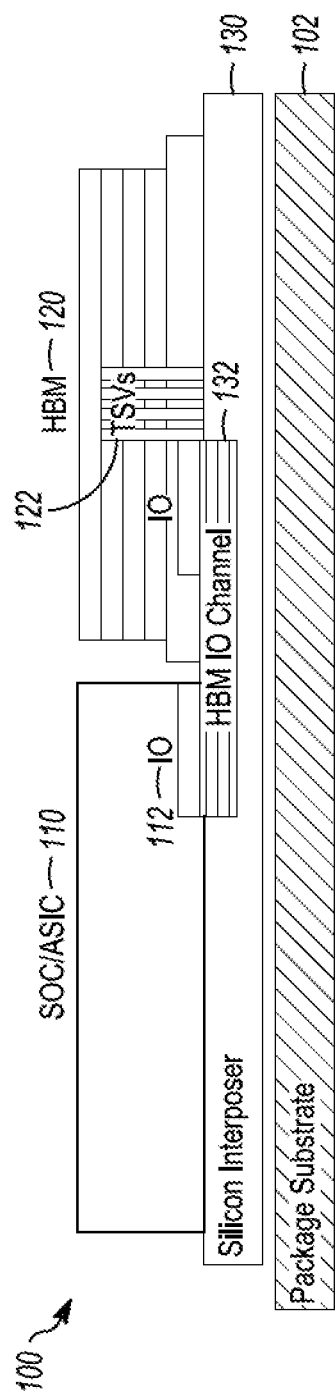
FIGS. 1A and 1B each illustrate a cross-sectional view of a package in accordance with some embodiments.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials, and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description may use perspective-based descriptions such as top/bottom, in/out, over/under, and the like. Such descriptions are merely used to facilitate the discussion and are not intended to restrict the application of embodiments described herein to any particular orientation. In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous. The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

As used herein, the term "module" may refer to, be part of, or include an ASIC, an electronic circuit, a SOC, a processor (shared, dedicated, or group), and/or memory (shared, dedicated, or group) that execute one or more software or firmware programs, a combinational logic circuit, and/or other suitable components that provide the described functionality.

As above, the continued desire for high memory bandwidth between a CPU and active memory device such as a Static Random Access Memory (SRAM) or Dynamic Random Access Memory (DRAM) for next generation devices have led to the desire for high bandwidth on-package input/output (I/O) links. Moreover, it is desirable for the I/O links to provide high bandwidth and low power consumption. The bandwidth of an I/O link is proportional to the number of data links and the data rate for each data link. To increase the number of data links, a commensurate increase in connection-related components such as wiring, substrate connections (bumps) and I/O circuitry may be increased. The use of a relatively low frequency with large number of I/O links (dense Multichip Packages (MCPs)) may result in a relatively low loss I/O channel and simpler circuitry (due to the lower frequency) at the cost of increasing the interconnect real estate. The interconnect real estate may include, for example, die area, interconnect area on the package and the number of package layers. Dense MCPs using interconnects that span a relatively short distance may enable an I/O channel having a low loss. Dense MCPs may, in some circumstances, be preferred over architectures in which the data rate is increased while the number of I/O links reduced, resulting in a higher insertion loss I/O channel and circuitry of increased complexity but reduced amount of interconnect real estate used.

Figure 1B:
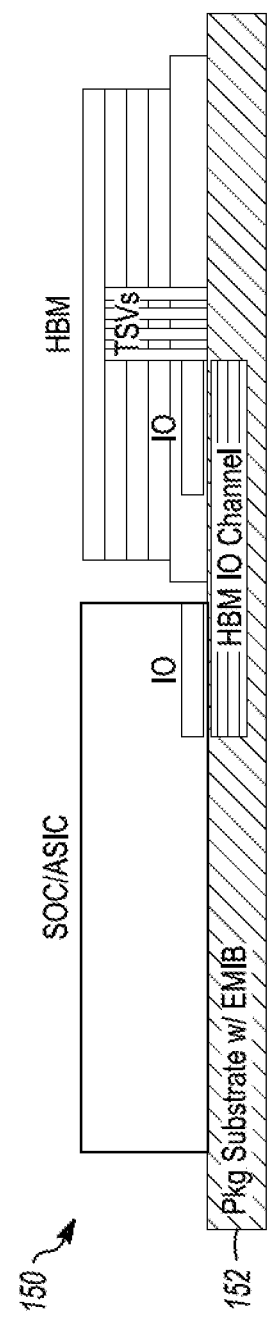

Dense MCPs can be used in integration of heterogeneous packages that contain die from different technologies and with different functionality. FIGS. 1A and 1B each illustrate a cross-sectional view of a package in accordance with some embodiments. The package 100, 150 of FIG. 1A or 1B may be a high bandwidth memory (HBM) package architecture that uses a silicon interposer or an embedded Multi-die Interconnect Bridge (EMIB), respectively. An EMIB is a die-to-die bridge embedded in the substrate used in a 2.5D architecture.

As shown in FIG. 1A, the HBM architecture 100 may contain circuitry (an ASIC or SOC 110 and a HBM 120) disposed on a substrate 102 formed from an organic material, which may be disposed on a motherboard (or printed circuit board (PCB)). A silicon interposer 130 that is larger than the ASIC/SOC 110 and HBM 120 combined may be disposed between the substrate 102 and the circuitry. The ASIC/SOC 110 and HBM 120 may be electrically connected through an I/O channel 132 formed in the silicon interposer 130. The ASIC/SOC 110 and HBM 120 may be electrically connected with the I/O channel 132 through interconnect structures 112, and, for the HBM 120, one or more TSVs 122. The HBM architecture 150 of FIG. 1B may be similar to that of FIG. 1A, excepting certain differences, such as the EMIB 152 may replace the silicon interposer 130 of FIG. 1A.

However, while high bandwidth memory (HBM) package architectures may use a silicon interposer-based solution or an EMIB solution for memory to ASIC/SOC high density connectivity, a further bandwidth increase and latency decrease may be desired between the components and without the expense of an HBM and TSVs. In particular, as shown in FIGS. 1A and 1B, HBM memory devices have the I/O (interconnect structure) buried deep under the die shadow. HBMs are floorplanned in this manner because as illustrated the I/Os communicate with discrete stacked memory DRAMs connected through TSVs. These memory devices come at a high cost premium due to the limited supplier base and the high cost, technical barrier to entry with the TSV process.

Figure 2:
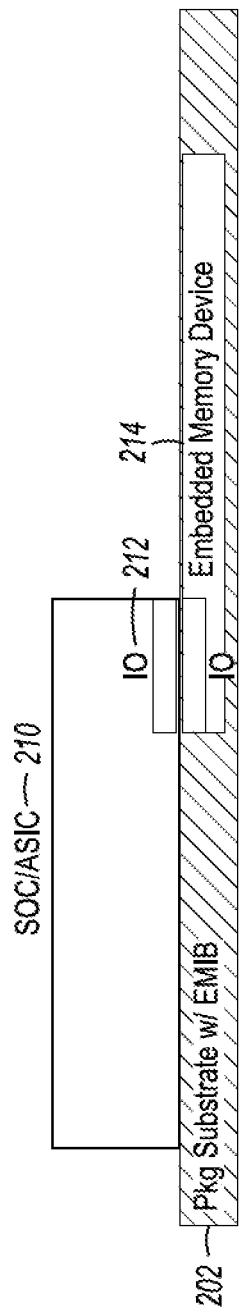
FIG. 2 illustrates a cross-sectional view of a package in accordance with some embodiments.

New high bandwidth memory solutions with lower cost suppliers may avoid TSVs and have unique communication channels for each memory device. FIG. 2 illustrates a cross-sectional view of a package in accordance with some embodiments. As shown in FIG. 2, the package 200 may contain a high bandwidth main die 210 disposed on a substrate 202, which may be disposed on a PCB (not shown). The main die 210 may be a processor such as an ASIC or SOC. The substrate 202 may be formed from an organic material used for integrated device fabrication and have various conductive metal layers and non-conductive layers fabricated thereon.

An embedded die 214 embedded in the substrate 202 may be used for heterogeneous integration in-package with the high bandwidth main die 210 to the memory die communication channel. The embedded die 214 may be an active memory device (e.g., SRAM or DRAM). The memory device 214 may be mounted with bumps up, face-to-face with the top mount ASIC/SOC 210 using an EMIB assembly process. Unlike the arrangement of FIG. 1A, the use of a Si interposer may be avoided. Low latency memory solutions may benefit from the reduction in IO channel length with a direct main die 210 to embedded die 214 vertical interconnect and the use of a single communication channel per memory device (i.e., separate I/O channels for each memory device), without the use of TSVs.

The ASIC/SOC 210 and memory device 214 may be electrically connected through interconnect structures 212, thereby enabling direct communication between the ASIC/SOC 210 and the memory device 214. The interconnect structures 212 may be composed of one or more electrically conductive materials. Examples of these materials may include, among others, copper (Cu), aluminum (Al), gold (Au), silver (Ag), nickel (Ni), palladium (Pd), tungsten (W) or combinations thereof.

As shown, the interconnect structure 212 associated with the memory device 214 may be skewed to the die edge of the DRAM/SRAM memory device 214 to minimize the overlap of the top mount ASIC/SOC 210 and the embedded memory device 214 with minimal impact to the I/O floorplanning of the ASIC/SOC 210. The ASIC/SOC 210 may be surface mounted on the IC package 200 and the memory device 214 embedded in the substrate 202 under the surface mounted ASIC/SOC 210 with the interconnect structure 212 of each die 210, 214 overlapping and aligned. The use of an embedded active memory device may replace a passive bridge utilized for the EMIB based 2.5D architectures. The embedded active memory device 214 may also reduce the cost and/or complexity of the overall assembly. The face-to-face connection between the ASIC/SOC 210 and the memory device 214 may also provide I/O driver power savings due to the short channel length, minimize memory access latency and thereby enable higher transfer rates, e.g., on the order of 2-3.2GB/s. Thus, for a HBM2 containing 8 channels of 128 bit memory, the total bandwidth is about 256-410 GB/s.

Figure 3A:
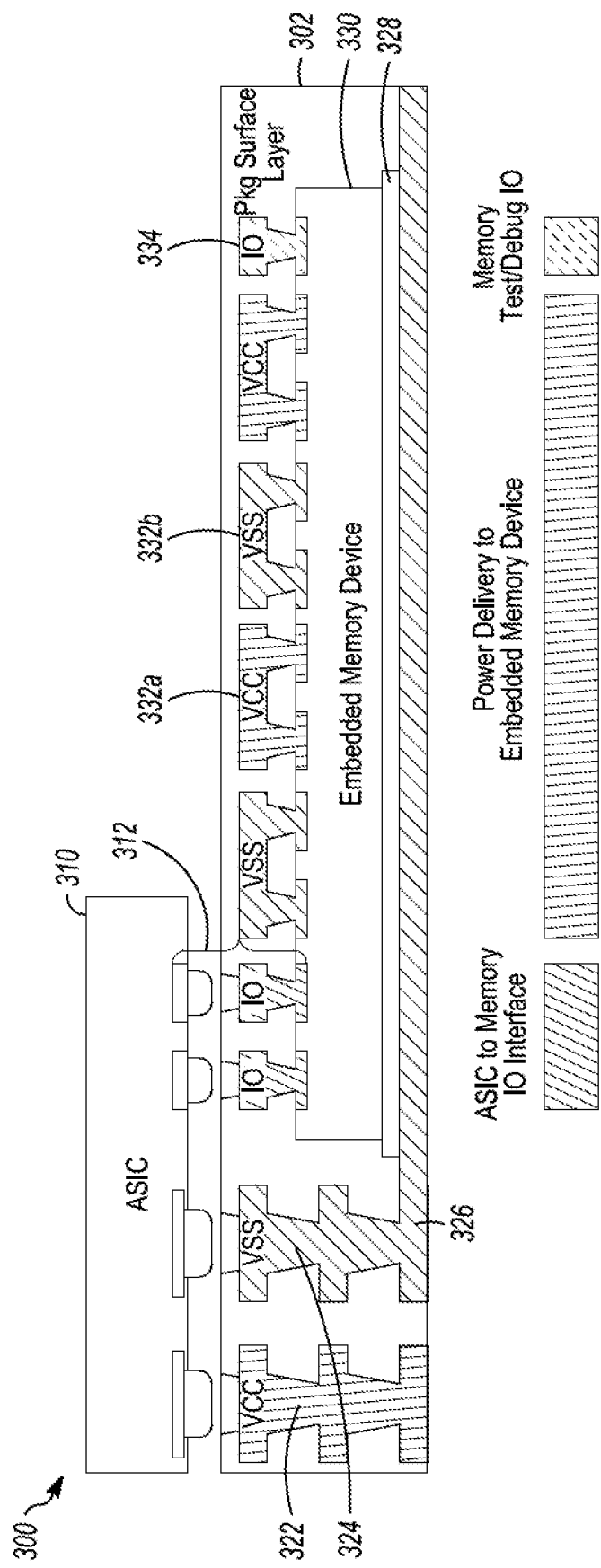
FIGS. 3A-3C illustrate views of a package in accordance with some embodiments.
Figure 3B:
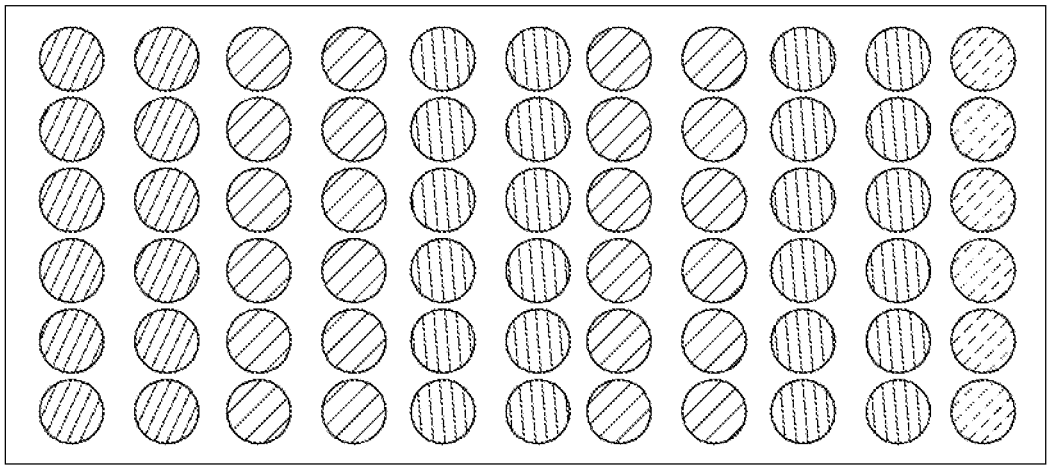
Figure 3C:
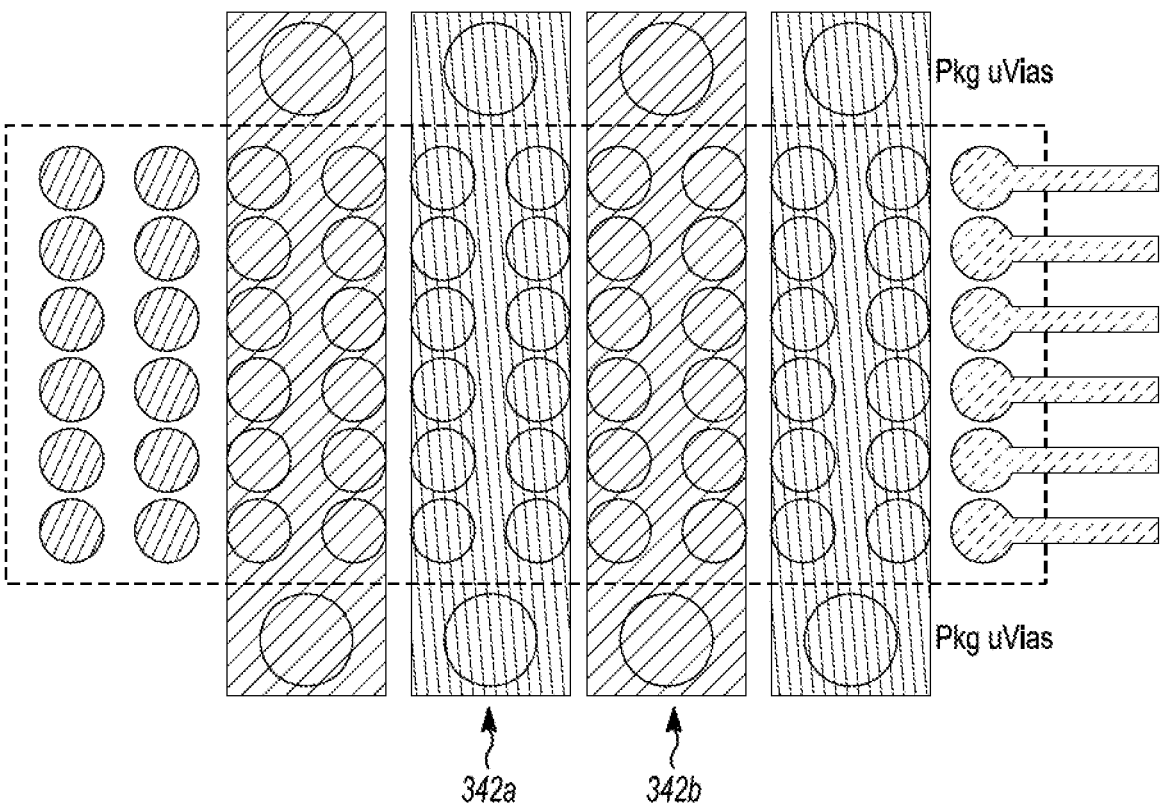

A more detailed view of the architecture is shown in FIGS. 3A-3C, which illustrate views of a package in accordance with some embodiments. FIG. 3A shows a cross-sectional area of the package, while FIGS. 3B and 3C show top views of the memory die and the surface layer of the substrate, respectively. The package 300, as above, may include a substrate 302 in which an active memory device 330 is embedded. The bottom of the substrate 302 may have a conductive layer disposed thereon, which may be deposited by sputtering, for example, and subsequently patterned. A ground plane 326 may be formed from the conductive layer. In some embodiments, the ground plane 326 may be formed by removing a portion of the conductive layer, e.g., via a photolithographic process such as depositing a positive or negative photoresist layer, opening vias in the photoresist, sputtering metal over the entire structure after the vias have been opened in the photoresist, and subsequently removing the photoresist, leaving the ground plane 326 and other portions of the conductive layer. The conductive layer may be formed from one or more materials similar to the conductive material above.

In some embodiments, the substrate 302 may be fabricated in a two-step process in which conductive and non-conductive layers are formed on one side, the side processed to open up a cavity and multiple vias via laser ablation (or wet etching) to remove the conductive and non-conductive material, and then processing continues on the remaining side. An attach film 328 may be deposited in the cavity over a portion of the ground plane 326 prior to embedding the memory device 330 via a photolithographic deposition process. The cavity may be large enough (about 5-15 mm) to embed the memory device 330. Note that the cavity may extend through the center of the substrate 302 and thus may be first partially formed on one side of the substrate 302 before being completed when processing the other side of the substrate 302.

The memory device 330 may be disposed in the substrate 302 such that the memory device 330 is disposed entirely over the ground or power plane 326. In addition, the planar area of the non-conductive buffer layer 328 may be larger than and overlap entirely that of the memory device 330 such that the attach film 328 is disposed entirely between the ground plane 326 and the memory device 330 to attach the memory device 330 to the ground plane 326. By embedding the memory device 330 in the substrate 302, top side package caps can be positioned closer to the main ASIC/SOC 310 than with conventional surface mount memory solutions because a top side keep-out-zone (KOZ) associated with the embedded memory device 330 itself or its die epoxy underfill may be avoided.

The embedded memory device 330 may be mounted with C4 bumps up—that is facing the opening and eventually the ASIC/SOC 310. The C4 bumps may provide various connections to circuitry in the memory device 330, including bumps for power and ground, bumps for connection to the ASIC/SOC 310 and, if desired, bumps for wired connection to testing/debugging circuitry. The bumps may be arranged in a ball-grid array (BGA) or land-grid array (LGA) configuration and may be coupled to one or more pads on the surface of the ASIC/SOC 310 and memory device 330. The pitch of the bumps, like that of the ASIC/SOC 310 may be different dependent on whether for high density I/O connections (about 35-75 μm) or lower density I/O connections/power/ground/test (about 100-130 μm). In some embodiments, only small pockets of high density I/O connections may be present.

The ASIC/SOC 310 may be mounted in a flip-chip configuration on the substrate 302. The ASIC/SOC 310 and memory device 330 may be electrically connected through interconnect structures 312. The interconnect structures 312 may include contacts pads and bumps on a surface of each of the ASIC/SOC 310 and memory device 330, as well as vias filled with conductive material between the bumps. In particular, the interconnect structures 312 may include the C4 metal pad and the C4 bump of the top mount die 310 (in this case an ASIC/SOC, but may be different in other embodiments), and a pad layer of the embedded memory device 330 and a short uvia connection from the C4 metal pad to the pad layer of the embedded memory device 330. The interconnect structure 312 may be less than about 100 μm, with the surface of the embedded memory device 330 about 45-60 μm from the surface of the substrate 302. As the top layer of solder resist on the surface of the substrate 302 may be about 20-25 μm, the distance from the top of the (power/ground/I/O) connections 332a, 332b on the embedded memory device 330 to the surface of the substrate 302 may be about 15 μm.

The process for creating the filled vias may be similar to the above process, e.g., using laser ablation to open up vias in the non-conductive layer of the substrate 302 and filling the vias with metal to connect the metal of the conductive layers of the substrate 302. A similar process may be used to create power and ground connections 322, 324. As shown in FIG. 3C, power and ground strips 342a, 342b are disposed across the surface of the substrate 302 to enable current flow (and a return path) for power and ground to the embedded memory device 330.

The interconnect structures 312 may be composed one or more of the above conductive materials, with different portions of the interconnect structures 312 able to be composed of different conductive materials. The ASIC/SOC 310 and the embedded memory device 330 may thus be skewed to only partially overlap—as shown, such that I/O contact pads of the interconnect structure 312 overlap, with the ASIC/SOC 310 and the embedded memory device 330 extending laterally in different directions from the I/O contact pads. The amount of overlap may be dependent on both the number of I/O contact rows and the pitch, and may be, for example, about 1 mm. Note that although only two rows of high density I/O contacts are shown, the number of rows may vary. The use of the interconnect structure 312 (i.e., the directly vertically aligned contacts) permits the I/O connections of the ASIC/SOC 310 and embedded memory device 330 to be minimized as no interposing layer or routing of the signals in the I/O connections is used.

As mentioned above, conductive material may be deposited in the vias to the conductive layer to form power and ground connections 322, 324. The ground connection may be in electrical contact with the ground plane 326. Similarly, power may be delivered to the embedded memory device 330 through power flood planes patterned on the surface of the embedded memory device 330 with uvias connecting to the embedded memory die pad layer. In some embodiments, the substrate 302 may contain various non-conductive layers that separate conductive layers used to route signals and/or power and ground. The embedded memory device 330 may be embedded in the substrate after formation of these layers.

Although not show, power and ground (and perhaps signals) may be routed throughout various conductive layers in the substrate 302. A test or debug I/O connection 334 can also utilize the surface of the package 300 to escape from the die edge of the embedded memory device 330. The test I/O connection 334 may be connected to test equipment (not shown) to test whether the embedded memory device 330 is functioning correctly, e.g., by undertaking random storage and access. In some embodiments, a heat dissipater (not shown) may be positioned above the embedded memory device 330 to direct heat flow from the embedded memory device 330. The heat dissipater may be a dummy die, set of fins or other heat dissipating device that creates a fairly direct heat path to a thermal solution when heat dissipation is desired.

In some embodiments, a non-conductive layer may be deposited after the memory device 330 is placed in the cavity. The interconnect structure 312 in the substrate 302 and power and ground connections 322, 324 may then be formed in the non-conductive layer through a photolithographic process similar to that above. In some embodiments, a further non-conductive layer may be deposited on the interconnect structure 312 and power and ground connections 322, 324. Connections to the interconnect structure 312 in the substrate 302 and power and ground connections 322, 324 may then be formed in the further non-conductive layer through a photolithographic process similar to that above. Note that although only two rows of the interconnect structure 312 are shown to overlap in FIGS. 3A-3C, the amount of overlap may vary in other embodiments.

Although FIGS. 2 and 3A illustrate the use of a single, embedded memory device, in other embodiments more than one memory device may be used. For example, in some embodiments, multiple memory devices may be embedded in the substrate 302, with connections to the ASIC/SOC 310. Similar to the arrangement shown in FIG. 2, only an edge of the ASIC/SOC 310 and the memory devices may overlap, i.e., skewed to only partially overlap in different directions. That is, the memory devices may be disposed in cavities in the substrate on opposite sides of the ASIC/SOC 310 to overlap opposing edges of the ASIC/SOC 310.

Figure 4A:
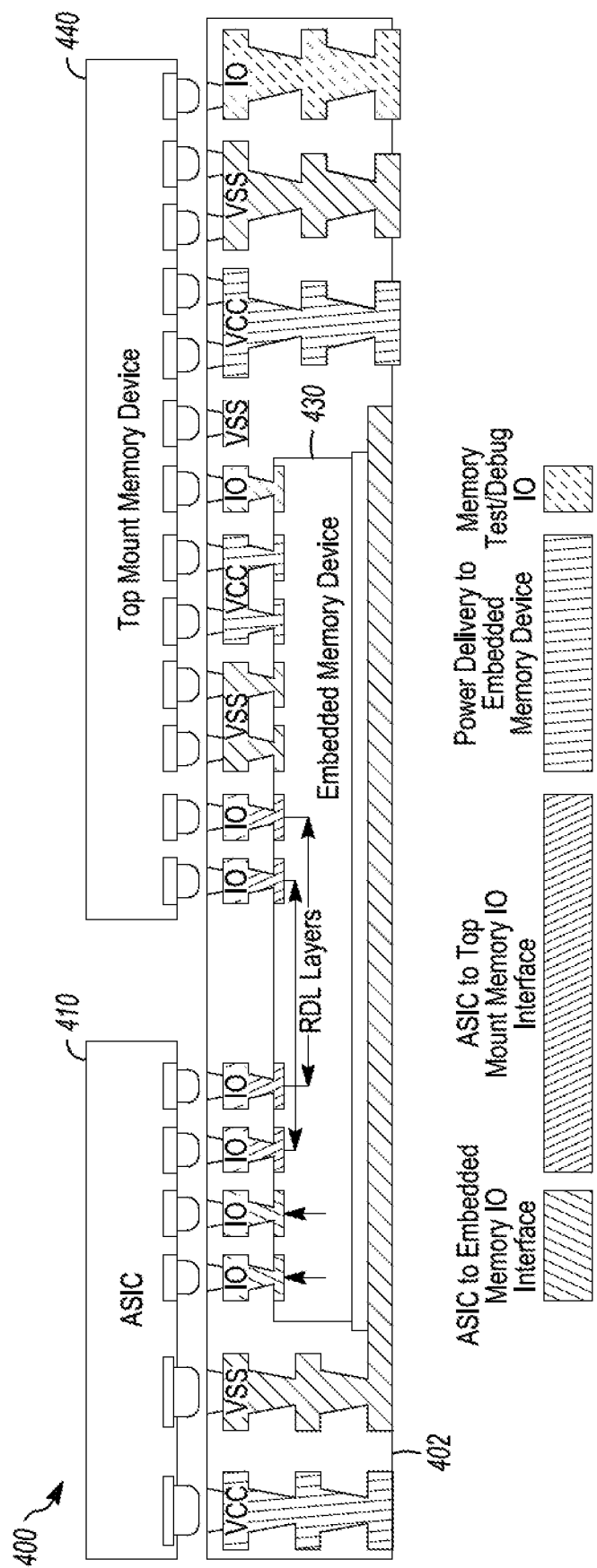
FIGS. 4A and 4B illustrate views of a package in accordance with some embodiments.
Figure 4B:
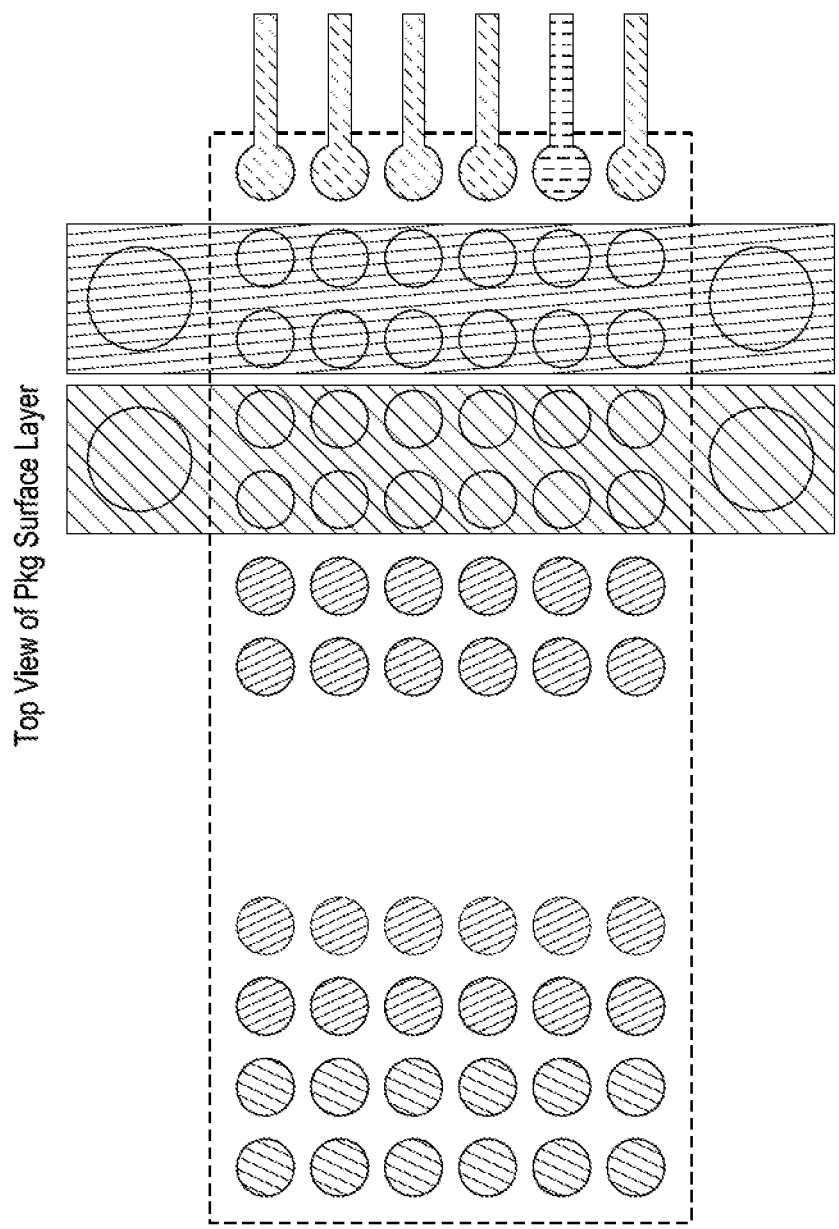

In other embodiments, the embedded memory device(s) may be used in addition to one or more top mounted memory devices. Such an embodiment is shown in FIGS. 4A and 4B, which illustrate views of a package in accordance with some embodiments. FIG. 4A shows a cross-sectional area of the package, while FIG. 4B shows a top view of the surface layer of the substrate. The package 400 may include a substrate 402 in which an active memory device 430 is embedded and both an ASIC/SOC 410 and additional memory device 440 are surface-mounted on the substrate 402. The ASIC/SOC 410 and the addition memory device 440 may extend laterally on the substrate in opposite directions on the embedded memory device 430. In some embodiments, the distance between the ASIC/SOC 410 and the additional memory device 440 may be as little as about 100 μm or can extend to several mm. The layers and interconnections shown in FIG. 4A may be similar to those shown in FIG. 3A. The amount of overlap between the embedded memory device 430 and both the ASIC/SOC 410 and the addition memory device 440 may extend to about 2 mm or more.

The embedded memory device 430 and the surface-mounted memory device 440 may be similar or the same die, thereby saving costs associated with using different die. In addition to the power and I/O interconnects to the ASIC/SOC 410, further circuitry may be provided on the embedded memory device 430. In particular, redistribution (RDL) layers may be formed on or near the top of the embedded memory device 430 (using one or more conductive layers between the embedded memory device 430 and the surface of the substrate 402) to permit redistribution of signals between the ASIC/SOC 410 and the surface-mounted memory device 440 and create a communication channel between the ASIC/SOC 410 and the surface-mounted memory device 440. Power, ground, and I/O signals may be supplied to the surface-mounted memory device 440 via interconnections between the embedded memory device 430 and the surface-mounted memory device 440 as well as through circuitry in the substrate 402.

Figure 5A:
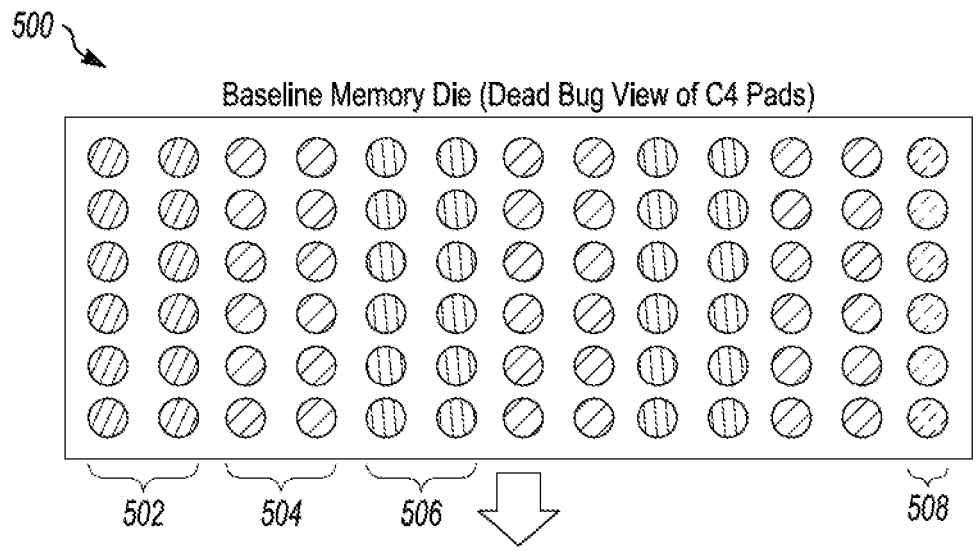
FIGS. 5A and 5B illustrate top views of packages in accordance with some embodiments.
Figure 5B:
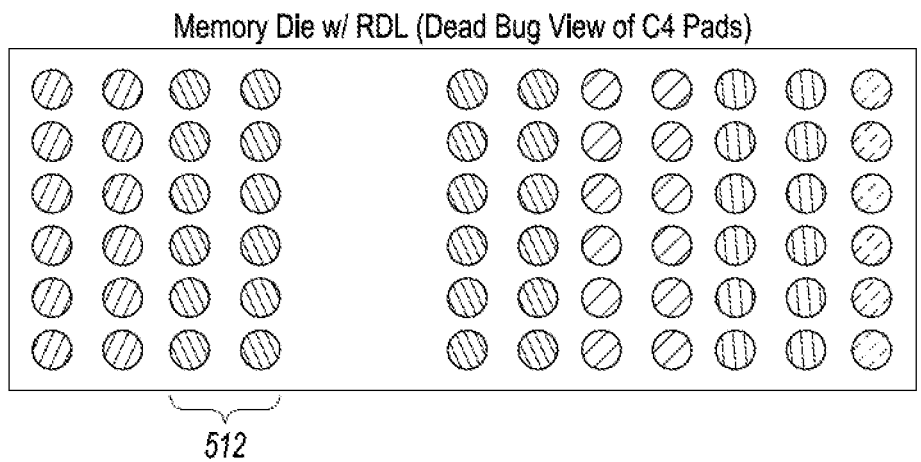
Figure 5C:
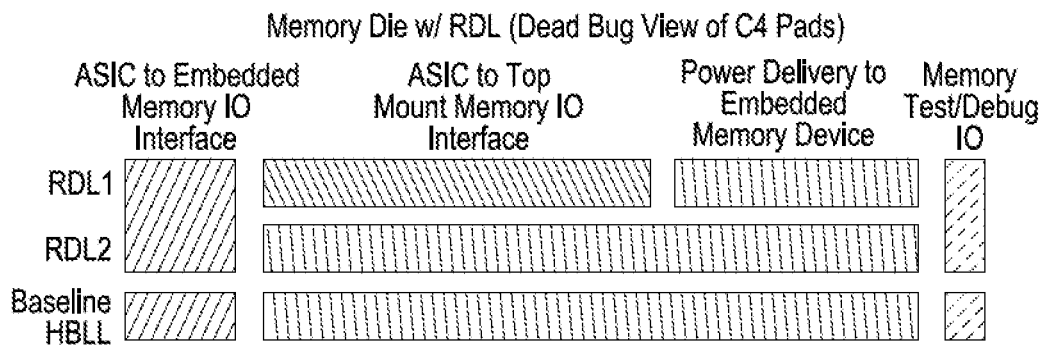
FIG. 5C illustrates a cross-sectional view of the embodiment of FIG. 5B.

FIGS. 5A and 5B illustrate top views of the packages of FIGS. 3A and 4A while FIG. 5C illustrates a cross-sectional view of the embodiment of FIG. 5B. As can be seen, FIG. 5A essentially duplicates FIG. 3B and FIG. 5B essentially duplicates FIG. 4B, adding labels to the rows of interconnects for the top view. In particular, the interconnects in FIG. 5A include I/O interconnects 502, power interconnects 504, ground interconnects 506 and test interconnects 508 for the embedded memory device and the interconnects in FIG. 5B include I/O interconnects, power interconnects, ground interconnects and test interconnects for the embedded memory device and RDL interconnects 512 for the top mounted memory device. As shown in FIG. 5C, the I/O interconnects 502 of the High-Bandwidth Low-Latency (HBLL) connections and the test interconnects 508 may extend through multiple RDL (conductor) layers. The RDL interconnects 512 may only extend through a single RDL layer, with the remaining RDL layer being used to permit spreading of the power and ground interconnects 504, 506. In other embodiments, the RDL interconnects may extend through more than one RDL layer.

Figure 6A:
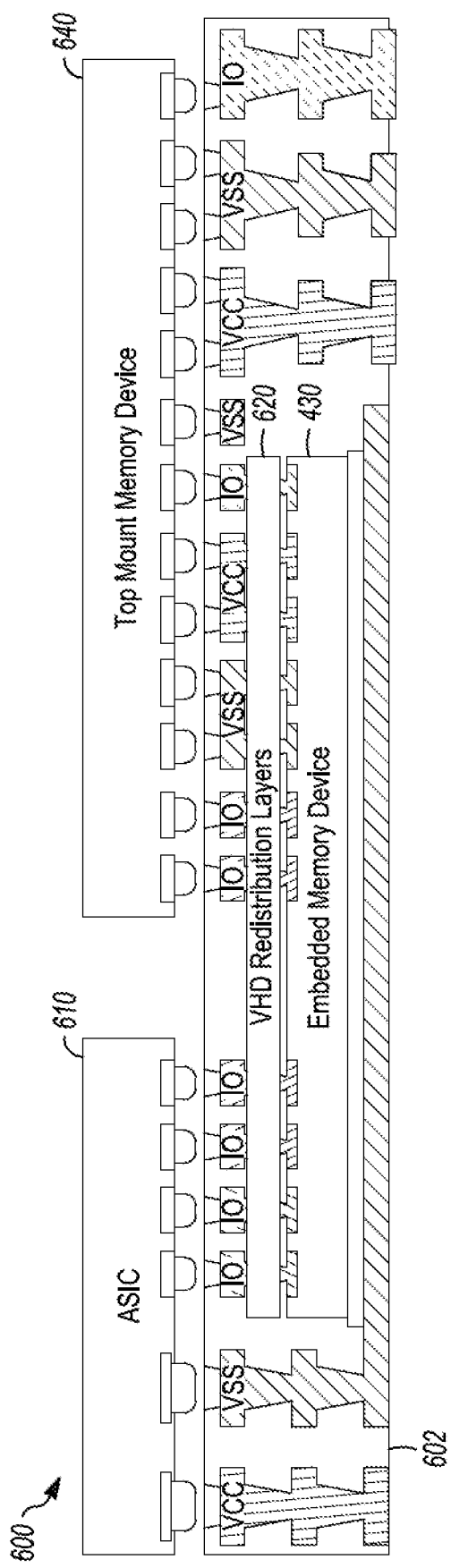
FIGS. 6A and 6B illustrate cross-sectional views of a package in accordance with some embodiments.
Figure 6B:
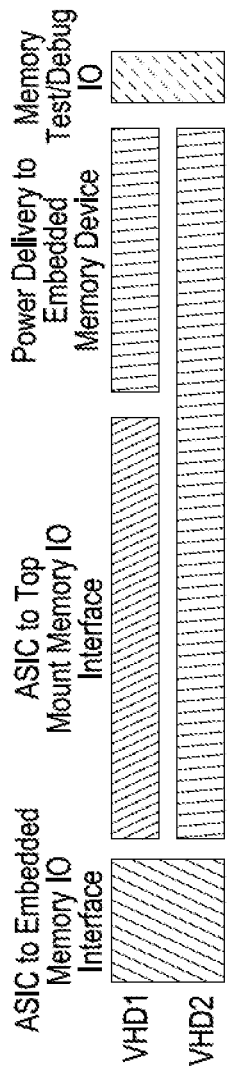

As may be clear, when adding a top mounted memory device, some of the benefits of the reduced channel length may be lost in the interest of doubling memory capacity with a fixed ASIC/SOC shoreline by using the RDL layer interconnections. In another embodiment for connecting the top mounted memory device to the ASIC/SOC may be to utilize very high density (VHD) organic redistribution layers patterned above the embedded memory device, as shown in FIG. 6A. VHD organic redistribution layers may be have pitch traces that are sub-10 μm, such as a trace width and spacing of about 5 μm. Typical layers that route signals may have a trace width of about 1.5-2 μm and spacing of about 2-2.5 μm with some coplanar ground tracks on the routing layers (the JEDEC bump pattern is defined as 290 I/O/mm, which gives 145 I/O/mm if 2 routing layers is used). As shown, the package 600 may include an organic substrate 602 in which an active memory device 630 is embedded and both an ASIC/SOC 610 and additional memory device 640 are surface-mounted on the substrate 602. The one or more VHD organic redistribution layers 620 may be formed on the embedded memory device 630 only and may provide narrow line spacing of about 2-3 μm for high density signals. The various layers (other than the VHD organic redistribution layers 620) and interconnections shown in FIG. 6A may be similar to those shown in FIG. 4A. The use of the VHD organic layers 620 for redistribution may avoid the RDL processing on the embedded memory device but still connect the top mounted memory die 640 to the ASIC/SOC 610. Similar to FIG. 5C, in FIG. 6B the I/O interconnects and the test interconnects may extend through multiple VHD (conductor) layers. The RDL interconnects may only extend through a single VHD layer, with the remaining VHD layer being used to permit spreading of the power and ground interconnects. The RDL and VHD trace width and spacings may be similar.

Figure 7A:
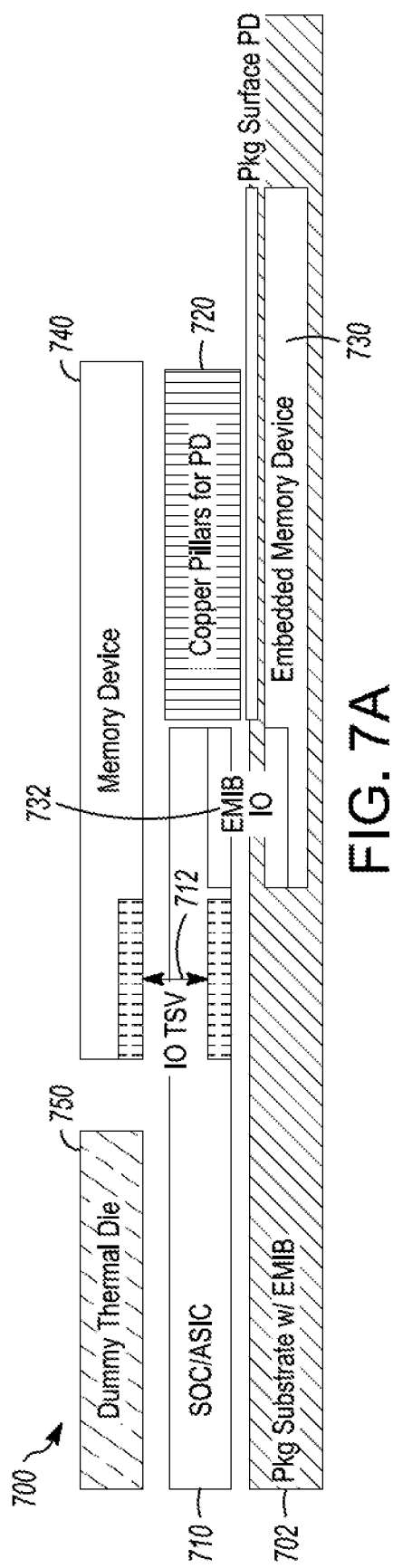
FIGS. 7A and 7B illustrate memory stacking in accordance with some embodiments.
Figure 7B:
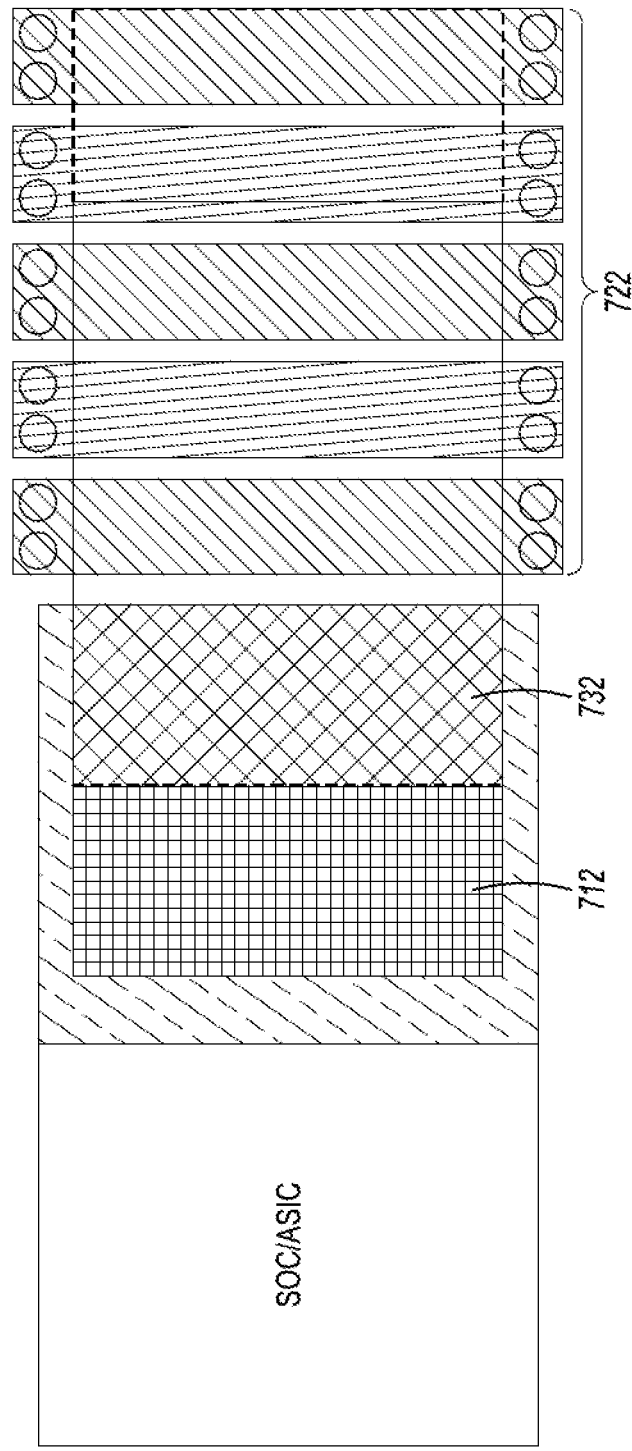

Another embodiment for embedded memory stacking is shown in FIGS. 7A and 7B. In FIG. 7A, the package 700 may include an organic substrate 702 in which an active memory device 730 is embedded and an ASIC/SOC 710 is surface-mounted on the substrate 702. In this case, however, the additional memory device 740 is mounted not on the surface of the substrate 702, but above the ASIC/SOC 710 due to the use of one or more TSVs 712. A heat dissipater 750 can be positioned above the ASIC/SOC 710 to provide an avenue for heat dissipation. Although not shown, the heat dissipater may be present in the above embodiments. The heat dissipater 750 may be positioned above the ASIC/SOC 710 to remove heat from the ASIC/SOC 710. The heat dissipater 750 may be a dummy die, set of fins or other heat dissipating device that creates a fairly direct heat path to a thermal solution when heat dissipation is desired. The heat dissipater 750 may be used in conjunction with another heat dissipater above the embedded memory device 730, in which case the heat dissipaters may be similar to or different from each other.

The top mounted memory device 740 on the ASIC/SOC 710 may overlap partially, and be connected via one or more TSVs 712, to the ASIC/SOC 710. The I/O pads of the top mounted memory device 740 and the ASIC/SOC 710 may align. As in previous embodiments, different I/O pads may be used to connect the ASIC/SOC 710 with the top mounted memory device 740 than with the embedded memory device 730. The non-overlapping portion of the top mounted memory device 740 may be supported over the embedded memory device 730 using a spacer 720 that extends laterally from the edge of the ASIC/SOC 710 to the edge of the top mounted memory device 740. The spacer 720 may be Cu pillars, for example, or another conductive material. The contact for the ASIC/SOC 710 and the top mounted memory device 740 may be aligned to enable the TSVs 712 to be used to establish the I/O connection therebetween. Similarly, the contacts for the ASIC/SOC 710 and the embedded memory device 730 may be aligned to enable a minimized path distance for contact to establish the I/O connection 732 therebetween.

FIG. 7B illustrates a top view in which the I/O connection 712 between the ASIC/SOC 710 and the top mounted memory device 740 and the I/O connection 732 between the ASIC/SOC 710 and the embedded memory device 730, as well as the power and ground connections 722 to the embedded memory device 730 and the top mounted memory device 740 are shown. This arrangement may allow for direct memory reuse for the two connectivity options, the use of TSV and RDL on the memory devices 730, 740 may be avoided.

The construction of the package architecture may thus be composed of an ASIC/SOC surface mounted on a package with the memory I/O positioned on the die edge. A memory device (DRAM or SRAM) may be embedded with its I/O positioned directly below the I/O of the top mount ASIC/SOC. The embedded process may follow that of an EMIB with the passive bridge replaced with a functional memory device. The communication channel between the two devices may be through a very short vertical interconnect (less than about 100 μm) that includes the C4 bump of the top mount die and a short uvia connection from the C4 metal pad to the pad layer of the embedded memory device. The use of a memory device embedded in the substrate may reduce the connection distance between the embedded memory device and the ASIC/SOC, eliminating or minimizing associated KOZs.

Figure 8:
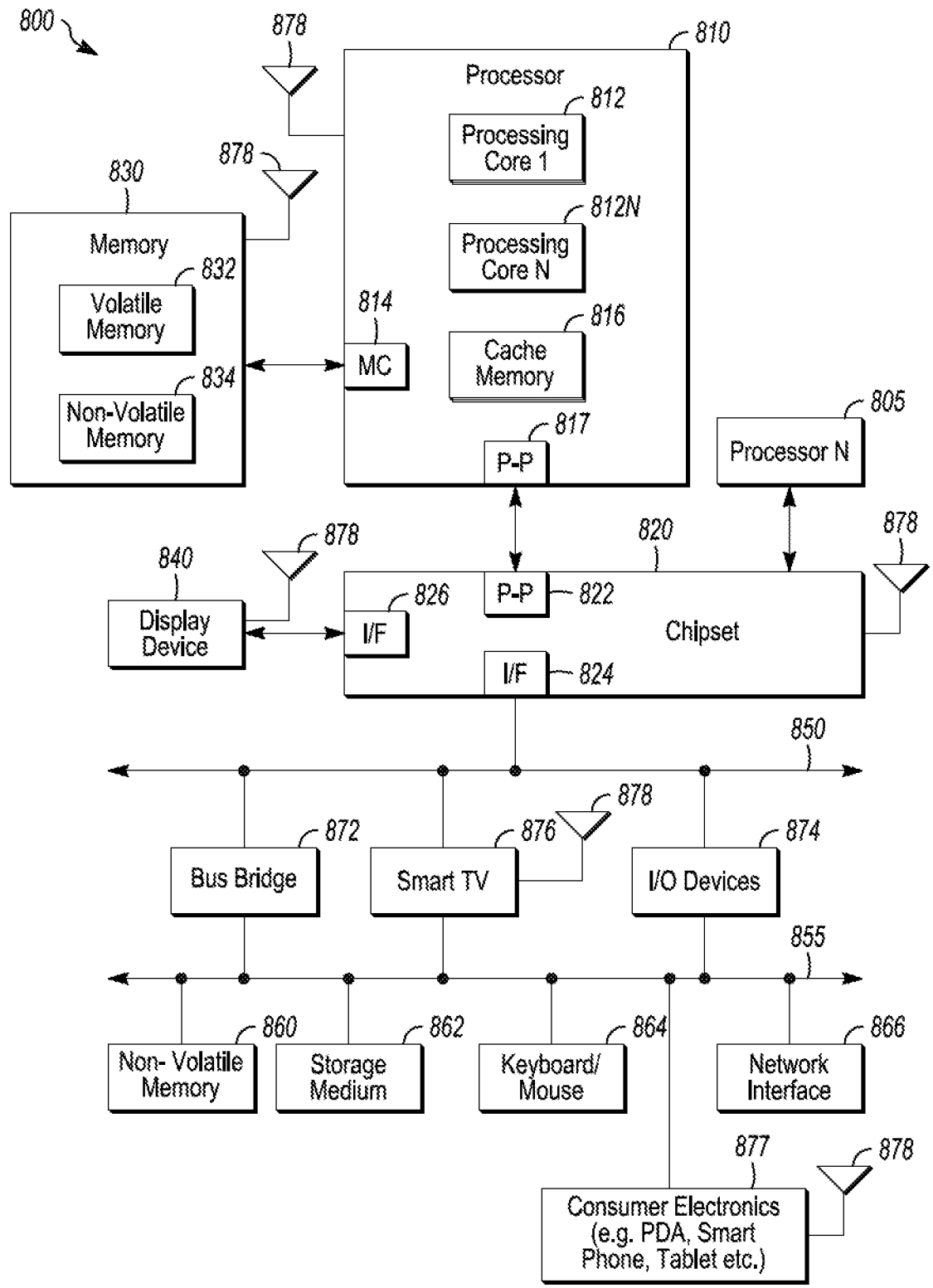
FIG. 8 shows a block diagram of an electronic device with shielding in accordance with some embodiments.

FIG. 8 shows a block diagram of an electronic device with shielding in accordance with some embodiments. FIG. 8 illustrates a system level diagram that includes an electronic device (e.g., system) having a structure and/or formed by the methods described herein. In one embodiment, system 800 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 800 is a system on a chip (SOC) system.

In one embodiment, processor 810 has one or more processor cores 812 and 812N, where 812N represents the Nth processor core inside processor 810 where N is a positive integer. In one embodiment, system 800 includes multiple processors including 810 and 805, where processor 805 has logic similar or identical to the logic of processor 810. In some embodiments, processing core 812 includes, but is not limited to, pre-fetch logic to fetch instructions, decode logic to decode the instructions, execution logic to execute instructions and the like. In some embodiments, processor 810 has a cache memory 816 to cache instructions and/or data for system 800. Cache memory 816 may be organized into a hierarchal structure including one or more levels of cache memory.

In some embodiments, processor 810 includes a memory controller 814, which is operable to perform functions that enable the processor 810 to access and communicate with memory 830 that includes a volatile memory 832 and/or a non-volatile memory 834. In some embodiments, processor 810 is coupled with memory 830 and chipset 820. Processor 810 may also be coupled to a wireless antenna 878 to communicate with any device configured to transmit and/or receive wireless signals. In one embodiment, an interface for wireless antenna 878 operates in accordance with the 3GPP and/or IEEE 802.11 standard protocol, Home Plug AV (HPAV), Ultra Wide Band (UWB), Bluetooth, WiMax, or any form of wireless communication protocol.

In some embodiments, volatile memory 832 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 834 includes, but is not limited to, flash memory, phase change memory (PCM), read-only memory (ROM), electrically erasable programmable read-only memory (EEPROM), or any other type of non-volatile memory device.

Memory 830 stores information and instructions to be executed by processor 810. In one embodiment, memory 830 may also store temporary variables or other intermediate information while processor 810 is executing instructions. In the illustrated embodiment, chipset 820 connects with processor 810 via Point-to-Point (PtP or P-P) interfaces 817 and 822. Chipset 820 enables processor 810 to connect to other elements in system 800. In some embodiments of the example system, interfaces 817 and 822 operate in accordance with a PtP communication protocol such as the Intel® QuickPath Interconnect (QPI) or the like. In other embodiments, a different interconnect may be used.

In some embodiments, chipset 820 is operable to communicate with processor 810, 805N, display device 840, and other devices, including a bus bridge 872, a smart TV 876, I/O devices 874, nonvolatile memory 860, a storage medium (such as one or more mass storage devices) 862, a keyboard/mouse 864, a network interface 866, and various forms of consumer electronics 877 (such as a PDA, smart phone, tablet etc.), etc. In one embodiment, chipset 820 couples with these devices through an interface 824. Chipset 820 may also be coupled to a wireless antenna 878 to communicate with any device configured to transmit and/or receive wireless signals.

Chipset 820 connects to display device 840 via interface 826. Display 840 may be, for example, a liquid crystal display (LCD), a light emitting diode (LED) array, an organic light emitting diode (OLED) array, or any other form of visual display device. In some embodiments of the example system, processor 810 and chipset 820 are merged into a single SOC. In addition, chipset 820 connects to one or more buses 850 and 855 that interconnect various system elements, such as I/O devices 874, nonvolatile memory 860, storage medium 862, a keyboard/mouse 864, and network interface 866. Buses 850 and 855 may be interconnected together via a bus bridge 872.

In one embodiment, mass storage device 862 includes, but is not limited to, a solid state drive, a hard disk drive, a universal serial bus flash memory drive, or any other form of computer data storage medium. In one embodiment, network interface 866 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the 3GPP standard and its related family, the IEEE 802.11 standard and its related family, Home Plug AV (HPAV), Ultra Wide Band (UWB), Bluetooth, WiMax, or any form of wireless communication protocol.

While the modules shown in FIG. 8 are depicted as separate blocks within the system 800, the functions performed by some of these blocks may be integrated within a single semiconductor circuit or may be implemented using two or more separate integrated circuits. For example, although cache memory 816 is depicted as a separate block within processor 810, cache memory 816 (or selected aspects of 816) can be incorporated into processor core 812.

ADDITIONAL NOTES AND EXAMPLES

Example 1 is an electronic package comprising: a substrate comprising a cavity; a memory device embedded in the cavity and comprising input/output (I/O) memory device pads; and a processor disposed on the substrate and comprising I/O processor pads, the I/O processor and memory device pads vertically aligned and electrically connected.

In Example 2, the subject matter of Example 1 includes, wherein the memory device comprises a plurality of contact pads that include the I/O memory device pads, ground pads connected with ground, power pads connected with power and test pads to test and debug the memory device, the test pads disposed on an opposite edge of the memory device as the I/O memory device pads.

In Example 3, the subject matter of Examples 1-2 includes, wherein the memory device and the processor partially overlap such that the memory device and the processor extend laterally in opposite directions from the I/O processor and memory device pads.

In Example 4, the subject matter of Examples 1-3 includes, power and ground strips disposed on a surface of the substrate extending a direction perpendicular to a direction of extension of the memory device from the processor, the power and ground strips having a length longer than a width of the memory device.

In Example 5, the subject matter of Examples 1-4 includes, a ground plane and attach film, the attach film disposed between the ground plane and the memory device to attach the memory device to the ground plane.

In Example 6, the subject matter of Examples 1-5 includes, another memory device disposed over a surface of the substrate, the other memory device partially overlapping the memory device.

In Example 7, the subject matter of Example 6 includes, a redistribution layer formed within the substrate between the memory device and a surface of the substrate, the redistribution layer electrically coupling I/O contact pads of the other memory device and other I/O processor contact pads of the processor.

In Example 8, the subject matter of Example 7 includes, wherein: the redistribution layer is formed on a portion of a first conductive layer, and at least one of power or ground signals are formed on another portion of the first conductive layer and on a second conductive layer between the memory device and the redistribution layer.

In Example 9, the subject matter of Examples 6-8 includes, a very high density (VHD) organic layer formed within the substrate between the memory device and the other memory device, the VHD organic layer comprising signal lines having high density spacing.

In Example 10, the subject matter of Examples 6-9 includes, wherein the other memory device is disposed on the surface of the substrate laterally adjacent to the processor and extends from the memory device in an opposite direction from a direction of extension of the processor from the memory device.

In Example 11, the subject matter of Examples 6-10 includes, wherein the other memory device is disposed on and partially overlaps the processor, and I/O contact pads of the other memory device and other I/O processor contact pads of the processor are vertically aligned and connected through one or more Through Silicon Vias (TSVs).

In Example 12, the subject matter of Example 11 includes, a spacer disposed adjacent to the processor and between the other memory device and the substrate to support a portion of the other memory device that overhangs from the processor.

In Example 13, the subject matter of Examples 10-12 includes, a heat dissipater disposed on the processor and adjacent to the other memory device.

Example 14 is a method for connecting a processor and memory device, the method comprising: forming a cavity in a substrate using laser ablation during processing of opposing sides of the substrate; embedding a memory device in the cavity with C4 bumps of the memory device facing towards a surface of the substrate on which a processor is to be placed, the memory device being entirely disposed within the substrate; fabricating I/O, power and ground interconnects to the memory device, the I/O interconnects having a pitch substantially less than a pitch of the power and ground interconnects; and attaching a processor to the substrate such that the I/O interconnects of the processor are vertically aligned with and electrically connected to I/O interconnects of the memory device.

In Example 15, the subject matter of Example 14 includes, forming power and ground strips on the surface of the substrate extending a direction perpendicular to a direction of extension of the memory device from the processor, the power and ground strips having a length longer than a width of the memory device.

In Example 16, the subject matter of Examples 14-15 includes, attaching the memory device to a ground plane using an attach film, the ground plane disposed on an opposite side of the memory device as the processor.

In Example 17, the subject matter of Examples 14-16 includes, attaching another memory device over the surface of the substrate, the other memory device partially overlapping the memory device; and connecting I/O interconnects of the other memory device with other I/O interconnects of the processor using a redistribution layer formed one of: on a surface of the memory device, or in very high density (VHD) organic layer formed between the memory device and the surface of the substrate.

In Example 18, the subject matter of Example 17 includes, wherein: the redistribution layer is formed on a portion of a first conductive layer, and at least one of power or ground signals are formed on another portion of the first conductive layer and on a second conductive layer between the memory device and the redistribution layer.

Example 19 is an electronic package comprising: a substrate comprising a cavity; a memory device embedded in the cavity; a processor disposed over a surface of the substrate skewed to partially overlap the memory device; and high density input/output (I/O) interconnects that connect the processor and memory device for data storage and retrieval in the memory device, the high density I/O interconnects having a pitch substantially less than a pitch of ground and power interconnects to the memory device.

In Example 20, the subject matter of Example 19 includes, another memory device disposed over the surface of the substrate, the other memory device partially overlapping the memory device on an opposite side of the memory device as the processor, the processor and other memory device connected via a redistribution layer formed one of on a surface of the memory device or within a very high density (VHD) organic layer formed between the surface of the substrate and the memory device.

Example 21 is at least one machine-readable medium including instructions that, when executed by processing circuitry, cause the processing circuitry to perform operations to implement of any of Examples 1-20.

Example 22 is an apparatus comprising means to implement of any of Examples 1-20.

Example 23 is a system to implement of any of Examples 1-20.

Example 24 is a method to implement of any of Examples 1-20.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

What is claimed:

1. A method for connecting a processor and memory device, the method comprising:
   forming a cavity in a substrate using laser ablation during processing of opposing sides of the substrate;
   embedding a memory device in the cavity with C4 bumps of the memory device facing towards a surface of the substrate on which a processor is to be placed, the memory device being entirely disposed within the substrate;
   fabricating I/O, power and ground interconnects to the memory device, the I/O interconnects having a pitch substantially less than a pitch of the power and ground interconnects;
   attaching a processor to the substrate such that the I/O interconnects of the processor are vertically aligned with and electrically connected to I/O interconnects of the memory device;
   attaching another memory device over the surface of the substrate, the another memory device partially overlapping the memory device; and
   connecting I/O interconnects of the another memory device with other I/O interconnects of the processor using a redistribution layer formed one of:
      on a surface of the memory device, or in very high density (VHD) organic layer formed between the memory device and the surface of the substrate, wherein:
   the redistribution layer is formed on a portion of a first conductive layer, and
   at least one of power or ground signals are formed on another portion of the first conductive layer and on a second conductive layer between the memory device and the redistribution layer.

2. The method of claim 1, further comprising forming power and ground strips on the surface of the substrate extending a direction perpendicular to a direction of extension of the memory device from the processor, the power and ground strips having a length longer than a width of the memory device.

3. The method of claim 1, further comprising attaching the memory device to a ground plane using an attach film, the ground plane disposed on an opposite side of the memory device as the processor.

4. A method of fabricating an electronic package, the method comprising:
   forming cavity in a substrate;
   embedding a memory device in the cavity, the memory device comprising input/output (I/O) memory device pads, and the memory device comprising a redistribution layer, wherein a portion of the substrate is over the redistribution layer;
   coupling a processor to the memory device by coupling I/O processor pads of the processor to the memory device pads of the memory device to vertically align the I/O processor pads and the memory device pads and to electrically connect the I/O processor pads to the memory device pads; and
   coupling another memory device to the memory device, the another memory device partially overlapping the memory device, wherein the another memory device is communicatively coupled to the processor by the redistribution layer of the memory device.

5. The method of claim 4, wherein the memory device comprises a plurality of contact pads that include the I/O memory device pads, a plurality of ground pads connected with ground, a plurality of power pads connected with power, and a plurality of test pads to test and debug the memory device, the test pads disposed on an opposite edge of the memory device as the I/O memory device pads.

6. The method of claim 4, wherein the memory device and the processor only partially overlap.

7. The method of claim 4, further comprising providing power and ground strips disposed on a surface of the substrate extending a direction perpendicular to a direction of extension of the memory device from the processor, the power and ground strips having a length longer than a width of the memory device.

8. The method of claim 4, wherein embedding the memory device in the cavity comprises attaching the memory device to a ground plane with an attach film.

9. The method of claim 4, further comprising forming a redistribution layer within the substrate between the memory device and a surface of the substrate, the redistribution layer electrically coupling I/O contact pads of the other memory device and other I/O processor contact pads of the processor.

10. The method of claim 9, wherein the redistribution layer is formed on a portion of a first conductive layer, and at least one of power or ground signals are formed on another portion of the first conductive layer and on a second conductive layer between the memory device and the redistribution layer.

11. The method of claim 4, further comprising forming an organic layer within the substrate between the memory device and the another memory device, the organic layer comprising signal lines having spacing.

12. The method of claim 4, wherein coupling the another memory device to the memory device comprises disposing the another memory device on the surface of the substrate laterally adjacent to the processor.

13. The method of claim 4, wherein coupling the another memory device to the memory device comprises disposing the another memory device on and partially overlapping the processor.

14. The method of claim 13, further comprising forming a spacer adjacent to the processor and between the another memory device and the substrate to support a portion of the another memory device that overhangs from the processor.

15. The package of claim 4, further comprising providing a heat dissipater on the processor and adjacent to the another memory device.

16. A method of fabricating an electronic package, the method comprising:
   forming cavity in a substrate;
   embedding a memory device in the cavity, the memory device comprising a redistribution layer, wherein a portion of the substrate is over the redistribution layer;
   coupling a processor to a surface of the substrate, the processor skewed to partially overlap the memory device, wherein coupling the processor to a surface of the substrate comprises connect the processor and memory device with input/output (I/O) interconnects for data storage and retrieval in the memory device, the I/O interconnects having a pitch substantially less than a pitch of ground and power interconnects to the memory device; and coupling another memory device to the surface of the substrate, the another memory device partially overlapping the memory device on an opposite side of the memory device as the processor, wherein the another memory device is communicatively coupled to the processor by the redistribution layer of the memory device.

17. The method of claim 16, wherein embedding a memory device in the cavity comprises attaching the memory device to a ground plane using an attach film.

18. The method of claim 16, further comprising forming power and ground strips on the surface of the substrate.

* * * * *